(12) United States Patent
Jang et al.

(10) Patent No.: US 8,362,504 B2
(45) Date of Patent: Jan. 29, 2013

(54) LIGHT EMITTING DIODE DEVICE USING NANOCRYSTAL-METAL OXIDE COMPOSITE AND METHOD FOR FABRICATING THE SAME

(75) Inventors: Eun Joo Jang, Suwon-si (KR); Shin Ae Jun, Seongnam-si (KR); Jung Eun Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 12/112,677

(22) Filed: Apr. 30, 2008

(65) Prior Publication Data

US 2008/0280161 A1 Nov. 13, 2008

(30) Foreign Application Priority Data

May 9, 2007 (KR) .................. 10-2007-0044974

(51) Int. Cl.
*H01L 33/00* (2010.01)
*H01L 21/00* (2006.01)

(52) U.S. Cl. ........... 257/98; 257/E33.061; 257/E29.071; 438/29

(58) Field of Classification Search .................. 257/100, 257/98, E33.061, 79, 43, E29.071; 438/29, 438/26, 27; 428/690; 427/66
See application file for complete search history.

(56) References Cited

U.S. PATENT DOCUMENTS

| | | | | |
|---|---|---|---|---|
| 6,501,091 B1 * | 12/2002 | Bawendi et al. | ................. | 257/14 |
| 6,608,439 B1 * | 8/2003 | Sokolik et al. | ................. | 313/512 |
| 2002/0066401 A1 * | 6/2002 | Peng et al. | ........................ | 117/68 |
| 2004/0116033 A1 * | 6/2004 | Ouderkirk et al. | ............... | 445/23 |
| 2004/0183085 A1 | 9/2004 | Okazaki | | |
| 2004/0229014 A1 * | 11/2004 | Schulz et al. | .................. | 428/141 |
| 2005/0205876 A1 | 9/2005 | Harada et al. | | |
| 2005/0215164 A1 * | 9/2005 | Mueller et al. | ................... | 445/24 |
| 2006/0060862 A1 * | 3/2006 | Bawendi et al. | ................. | 257/76 |
| 2006/0135669 A1 | 6/2006 | Ryang | | |
| 2006/0145169 A1 | 7/2006 | Wang et al. | | |
| 2006/0157686 A1 * | 7/2006 | Jang et al. | ......................... | 257/14 |
| 2007/0007881 A1 * | 1/2007 | Kim et al. | ...................... | 313/501 |
| 2007/0012941 A1 * | 1/2007 | Cheon | ............................. | 257/99 |
| 2007/0069202 A1 * | 3/2007 | Choi et al. | ....................... | 257/40 |
| 2007/0075306 A1 | 4/2007 | Hayashi et al. | | |
| 2007/0199109 A1 * | 8/2007 | Yi et al. | ......................... | 977/811 |
| 2008/0173886 A1 * | 7/2008 | Cheon et al. | .................... | 257/98 |

FOREIGN PATENT DOCUMENTS

| | | |
|---|---|---|
| EP | 1762642 A2 | 3/2007 |
| JP | 2003179269 | 6/2003 |
| KR | 20040092141 | 11/2004 |
| KR | 20060118161 | 11/2006 |
| KR | 20060135848 | 12/2006 |
| WO | 2005049711 A2 | 6/2005 |

OTHER PUBLICATIONS

Korean Office Action for application No. 10-2007-44974 with English translation; Mail date Mar. 28, 2008.
European Search Report; Jul. 13, 2010; RZ/P40857EP; 08155343.0-1226 / 1990842.

* cited by examiner

*Primary Examiner* — Thomas L Dickey
*Assistant Examiner* — Nikolay Yushin
(74) *Attorney, Agent, or Firm* — Cantor Colburn LLP (57) ABSTRACT

A light emitting diode device includes a light emitting diode chip and a nanocrystal-metal oxide monolith having a nanocrystal-metal oxide composite disposed on a light emitting surface of the light emitting diode chip.

23 Claims, 2 Drawing Sheets

LIGHT EMITTING DIODE DEVICE USING NANOCRYSTAL-METAL OXIDE COMPOSITE AND METHOD FOR FABRICATING THE SAME

This application claims priority to Korean Patent Application No. 10-2007-0044974, filed on May 9, 2007, and all the benefits accruing therefrom under 35 U.S.C. §119, the contents of which in its entirety are herein incorporated by reference.

BACKGROUND OF THE INVENTION

1. Field of the Invention

The present invention relates to a light emitting diode device having a nanocrystal-metal oxide composite and a method for fabricating the same. More particularly, the present invention relates to a light emitting diode device having improved luminous efficiency and stability, and a method for manufacturing the same.

2. Description of the Related Art

In general, a light emitting diode ("LED") has advantages such as being compact and having excellent monochromatic peak wavelength and light efficiency, for example. Thus, the light emitting diode is widely utilized as a light source in various display devices. Further, the light emitting diode has been actively developed as a high efficiency, high output light source which can replace a backlight of a lighting device and other display devices.

LED devices are generally commercialized in a package including an LED chip having a cathode and an anode connected thereto, an epoxy mold layer formed by uniformly coating a phosphor onto a surface of the LED chip, and a packing material for sealing the device. A p-type electrode and the cathode of the LED chip are connected with a thin metal line. An n-type electrode of the LED chip is connected to a metal post, e.g., an anode lead. Furthermore, a hole cup is prepared in front of the lead frame to form the anode. The LED chip is disposed in the hole cup and connected as described above. The hole cup reflects light emitted from a light emitting side of the LED chip.

Recently, a fabrication process of a white LED, which has been developed for use as a light source for a lighting or display device, utilizes a method of mixing yttrium aluminium garnet ("YAG") phosphor in a blue LED chip or mixing red phosphor and green phosphor to improve a color purity. However, when an inorganic phosphor is used as a luminescent material, it is difficult to obtain high efficiency and high color purity from the LED chip. Thus, a method having a semiconductor nanocrystal with various luminescent materials has been recently studied. The emissive and electrical properties are controlled by adjusting a size and/or composition, for example, of the nanocrystal. Moreover, the nanocrystal has advantages such as high efficiency and good color purity, making the nanocrystal attractive for use in light emitting devices such as an LED device, an organic electroluminescent device, a laser, holography or a sensor, for example.

In order to use the nanocrystal as a light converting luminescent material of an LED device, the nanocrystal dispersed in a solution state must be mixed with a polymer resin, for example, used in an encapsulation of the LED by applying a procedure similar to that discussed above for a conventional inorganic phosphor material. However, it is difficult to obtain a uniform dispersion of the nanocrystal in the polymer resin. Further, chemical damage, for example, causes defects on a surface of the polymer resin of the nanocrystal. As a result, degradation of the nanocrystal, such as a reduction of emission characteristics, occurs.

To reduce surface defects on the surface of the nanocrystal, a method for synthesizing the nanocrystal-metal oxide composite in a core-shell structure has been considered. However, even when the nanocrystal-metal oxide composite is prepared in the core-shell structure, a problem of a reduced efficiency due to chemical damage still exists. Further, a surface treatment procedure for improving dispersibility of the nanocrystal reduces luminous efficiency. Moreover, an organic substance used in the surface treatment may remain in the polymer resin, thereby causing other problems such as interrupting a curing process or reducing optical and thermal stability, for example.

BRIEF SUMMARY OF THE INVENTION

Exemplary embodiments of the present invention provide a light emitting diode device having excellent light dispersion and stability as well as excellent luminous efficiency, a method for fabricating the light emitting diode device via a simple fabrication processes without lowering the luminous efficiency, and various electronic devices having the light emitting diode device.

In an exemplary embodiment of the present invention, a light emitting diode device includes a light emitting diode chip and a nanocrystal-metal oxide monolith including a nanocrystal-metal oxide composite disposed on a light emitting surface of the light emitting diode chip.

The nanocrystal-metal oxide monolith may have a single layer, or in alternative exemplary embodiments, the nanocrystal-metal oxide monolith may have two or more layers. Each layer of the nanocrystal-metal oxide monolith having two or more layers may be arranged in substantially horizontal direction or a substantially vertical direction.

A gap between the light emitting diode chip and the nanocrystal-metal oxide monolith has a range of about 0.1 mm to about 1 mm.

The nanocrystal-metal oxide composite includes a metal nanocrystal or a semiconductor nanocrystal selected from the group consisting of II-VI compounds, III-V compounds, IV-VI compounds and IV compounds, or mixtures thereof. The nanocrystal-metal oxide composite may further include an over coating having a II-VI compound, a III-V compound, a IV-VI compound or a IV compound, or mixtures thereof.

The II-VI compounds include compounds selected from the group consisting of a binary compound, a ternary compound and a quaternary compound; the III-V compounds include compounds selected from the group consisting of a binary compound, a ternary compound and a quaternary compound; the IV-VI compounds include compounds selected from the group consisting of a binary compound, a ternary compound and a quaternary compound; and the IV compounds include compounds selected from the group consisting of a unary compound and a binary compound.

Further, the binary compound of the II-VI compounds includes CdS, CdSe, CdTe, ZnS, ZnSe, ZnTe, ZnO, HgS, HgSe and HgTe; the ternary compound of the II-VI compounds includes CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; the quaternary compound of the II-VI compounds includes CdZnSeS, CdZnSeTe, CdZnSTe, CdHgSeS, CdHgSeTe, CdHgSTe, HgZnSeS, HgZnSeTe and HgZnSTe; the binary compound of the II-V compounds includes GaN, GaP, GaAs, GaSb, AlN, AlP, AlAs, AlSb, InN, InP, InAs and InSb; the ternary compound of the III-V compounds includes GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; the quaternary compound of the III-V compounds includes GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb; the binary compound of the IV-VI compounds includes SnS, SnSe, SnTe, PbS, PbSe and PbTe; the ternary compound of the IV-VI compounds includes SnSeS, SnSeTe, SnSTe, PbSeS, PbSeTe, PbSTe, SnPbS, SnPbSe and SnPbTe; the quaternary compound of the IV-VI compounds includes SnPbSSe, SnPbSeTe and SnPbSTe; the unary compound of the IV compounds includes Si and Ge; and the binary compound of the IV compounds includes SiC and SiGe.

The nanocrystal-metal oxide composite may include $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO_2$ or $CrO_3$, or a mixture thereof.

An alternative exemplary embodiment of the present invention includes an electronic device such as a display device, a lighting device, a backlight unit or a sensor having the light emitting diode device.

In yet another alternative exemplary embodiment of the present invention, a method for fabricating a light emitting diode having a nanocrystal-metal oxide composite includes forming a nanocrystal-metal oxide monolith and disposing the nanocrystal-metal oxide monolith onto a light emitting diode chip.

The forming the nanocrystal-metal oxide monolith includes combining a nanocrystal, a metal oxide precursor, a solvent and a catalyst to form a nanocrystal-metal oxide precursor solution; forming a wet nanocrystal-metal oxide monolith by charging the nanocrystal-metal oxide precursor solution into a mold and subjecting the nanocrystal-metal oxide precursor solution charged into the mold to a polymerization reaction; and forming the nanocrystal-metal oxide monolith by drying and curing the wet nanocrystal-metal oxide monolith charged into the mold.

A multilayered nanocrystal-metal oxide monolith may be formed by successively repeating the forming the nanocrystal-metal oxide monolith two or more times.

The multilayered nanocrystal-metal oxide monolith is formed by using one of a same nanocrystal-metal oxide composite or different nanocrystal-metal oxide composites.

Each layer of the multilayered nanocrystal-metal oxide monolith is arranged in one of a horizontal direction or a vertical direction.

The metal oxide precursor includes metal alkoxide, metal halide or metal hydroxide. More specifically, in exemplary embodiments of the present invention, the metal oxide precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate or indium sulfate, or a mixture thereof.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items. It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Exemplary embodiments of the present invention will now be described in greater detail with reference to the accompanying drawings.

An exemplary embodiment of the present invention provides a light emitting diode device having a nanocrystal-metal oxide composite. The light emitting diode device having the nanocrystal-metal oxide monolith according to an exemplary embodiment of the present invention includes a light emitting diode chip and a nanocrystal-metal oxide monolith disposed on a light emitting surface of the light emitting diode chip.

The nanocrystal-metal oxide monolith effectively prevents or reduces problems of low luminous efficiency and cohesion which result from defects on a surface of the nanocrystal generated by polymer resins used in a conventional packing material. Thus, the light emitting diode device according to an exemplary embodiment of the present invention has high luminous efficiency and stability. Moreover, a refractive index of the nanocrystal-metal oxide monolith is smaller than a refractive index of nanocrystals and larger than a refractive index of a polymer medium, forming a refractive index gradient, thereby effectively reducing light diffusion and reflection and effectively maximizing light emission from the light emitting diode device according to an exemplary embodiment of the present invention.

Figure 1:
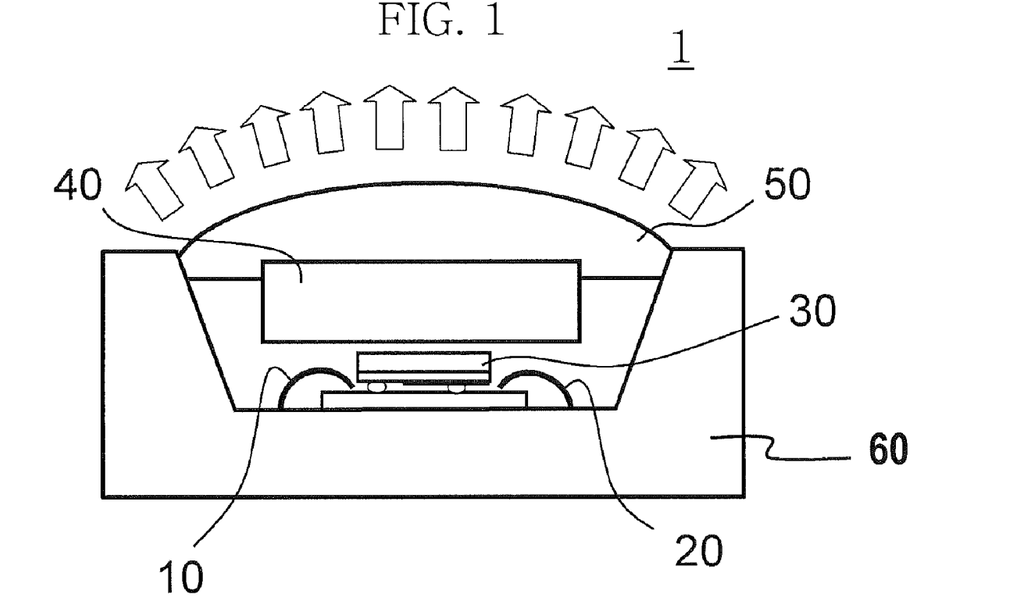
FIG. 1 is a partial cross-sectional view of a light emitting diode device according to an exemplary embodiment of the present invention.

FIG. 1 is a partial cross-sectional view of a light emitting diode device according to an exemplary embodiment of the present invention. Referring to FIG. 1, the light emitting diode device according to an exemplary embodiment of the present invention includes an LED package 1 having a light emitting diode chip 30, a cathode electrode 10 and an anode electrode 20 each connected to the light emitting diode chip 30, a nanocrystal-metal oxide monolith 40 disposed above a light emitting surface of the light emitting diode chip 30, a mold layer 50 formed on the nanocrystal-metal oxide monolith 40 and an outer material 60 for packaging the light emitting diode chip 30, the cathode electrode 10, the anode electrode 20, the nanocrystal-metal oxide monolith 40 and the mold layer 50.

The LED package 1 includes a cavity (not labeled) in which an inner wall of the outer material 60 is inclined toward an outer surface of the outer material 60, as shown in FIG. 1. The cavity provides an installation area for the light emitting diode chip 30, and defines lateral edges of the mold layer 50.

The nanocrystal-metal oxide monolith 40 may include a single layer or two or more layers, e.g., a multilayer nanocrystal-metal oxide monolith 40, in alternative exemplary embodiments thereof. In an exemplary embodiment including a nanocrystal-metal oxide monolith 40 having a single layer, the single layer may include at least one type of a nanocrystal. In alternative exemplary embodiments including a multilayer nanocrystal-metal oxide monolith 40, each layer of the multilayer nanocrystal-metal oxide monolith 40 may include the same or, alternatively, different types of nanocrystal-metal oxide composite, for example. Further regarding alternative exemplary embodiments having a multilayer nanocrystal-metal oxide monolith 40, each layer of the multilayer nanocrystal-metal oxide monolith 40 may be arranged in a substantially horizontal direction or a substantially vertical direction.

Figure 2A:
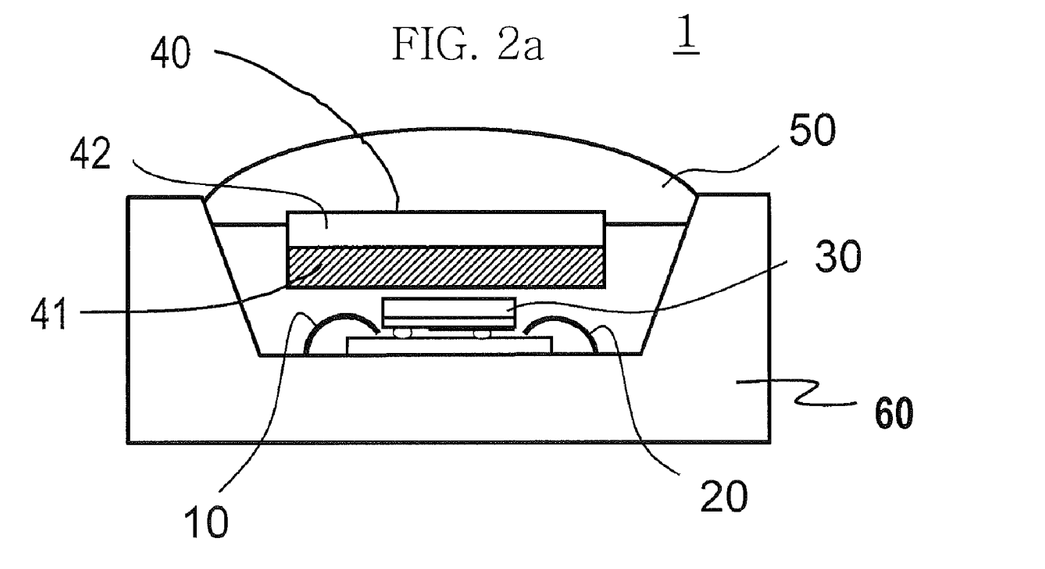
FIG. 2a is a partial cross-sectional view of a light emitting diode device according to an alternative exemplary embodiment of the present invention.
Figure 2B:
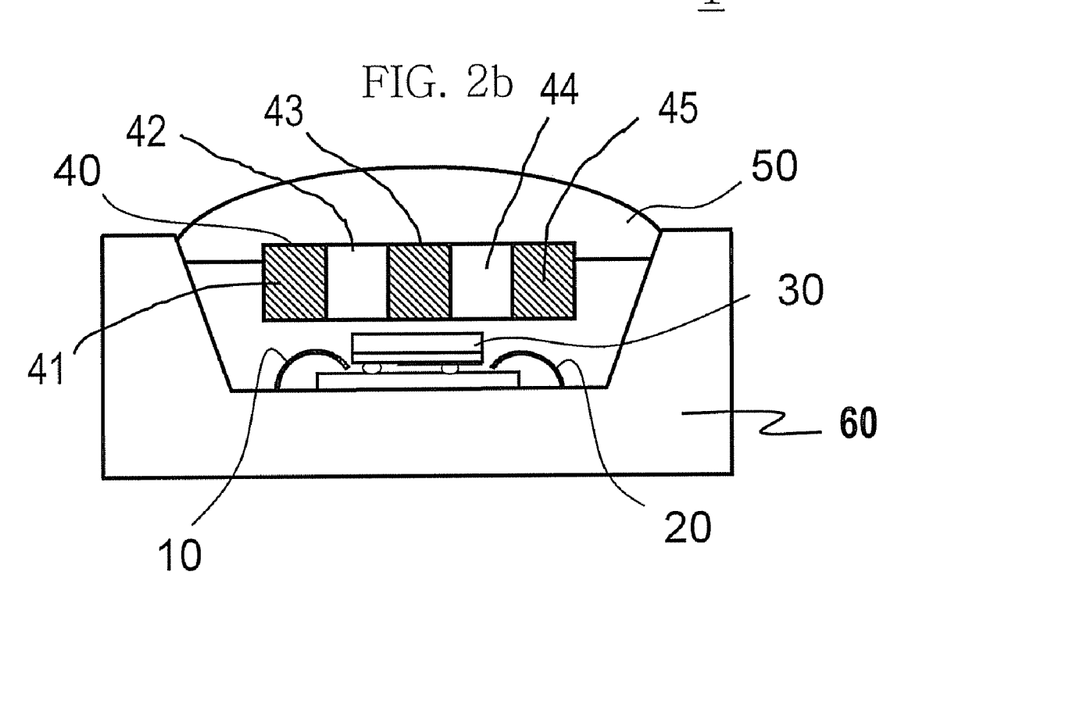
FIG. 2b is a partial cross-sectional view of a light emitting diode device according to yet another alternative exemplary embodiment of the present invention.

FIG. 2a is a partial cross-sectional view of a light emitting diode device according to an alternative exemplary embodiment of the present invention. More specifically, FIG. 2a is a partial cross-sectional view of a light emitting diode device according to an alternative exemplary embodiment of the present invention in which layers of a nanocrystal-metal oxide monolith are arranged in substantially horizontal direction. FIG. 2b is a partial cross-sectional view of a light emitting diode device according to yet another exemplary embodiment of the present invention. More specifically, FIG. 2b is a partial cross-sectional view of a light emitting diode device according to another exemplary embodiment of the present invention in which layers of a nanocrystal-metal oxide monolith are arranged in a substantially vertical direction.

The light emitting diode devices in FIGS. 2a and 2b are substantially the same as the light emitting diode device discussed above with reference to FIG. 1, except for differences in a nanocrystal-metal oxide monolith as described in further detail below. Thus, the same reference numerals refer to the same or like components in FIGS. 1, 2a and 2b, and repetitive descriptions thereof will hereinafter be omitted.

Referring to FIG. 2a, a light emitting diode device according to an alternative exemplary embodiment of the present invention includes an LED package 1 having a nanocrystal-metal oxide monolith 40 having a first layer 41 and a second layer 42, but alternative exemplary embodiments are not limited thereto. As illustrated in FIG. 2a, the second layer 42 is disposed above the first layer 41, e.g., layers of the nanocrystal-metal oxide monolith 40 are arranged in horizontal direction.

Referring to FIG. 2b, a light emitting diode device according to yet another alternative exemplary embodiment of the present invention includes an LED package 1 having a nanocrystal-metal oxide monolith 40 having a first layer 41, a second layer 42, a third layer 43, a fourth layer 44 and a fifth layer 45, but alternative exemplary embodiments are not limited thereto. As illustrated in FIG. 2a, the first layer 41, the second layer 42, the third layer 43, the fourth layer 44 and the fifth layer 45 are disposed adjacent to each other, e.g., layers of the nanocrystal-metal oxide monolith 40 are arranged in vertical direction.

Each layer of a horizontally or a vertically arranged multilayer nanocrystal-metal oxide monolith may include nanocrystals having different sizes so that each respective layer emits a different color.

For example, referring back to FIG. 2a, in an exemplary embodiment of the present invention, a metal oxide composite having a red light emitting nanocrystal is disposed in the first layer 41 closest to a an LED chip 30 which emits a blue color. Then, a metal oxide composite having a green light emitting nanocrystal is disposed in the second layer 42 above the first layer 41 having the metal oxide composite having the red light emitting nanocrystal. As a result, a light converted from the green light emitting nanocrystal being reabsorbed by the red light emitting nanocrystal is effectively prevented or reduced, resulting in a more effective light emitting diode device.

Referring again to FIGS. 1, 2a and 2b, the nanocrystal-metal oxide monolith 40 may be disposed directly on a light emitting surface of the light emitting diode chip 30. However, in exemplary embodiments of the present invention, the nanocrystal-metal oxide monolith 40 may be disposed to have a space having a range of about 0.1 mm to about 1 mm between the nanocrystal-metal oxide monolith 40 and the light emitting diode chip 30. As a result, heat is diffused, effectively reducing undesirable affects on the light emitting diode chip, and thereby improving a light extraction.

A nanocrystal of the nanocrystal-metal oxide monolith 40 in a light emitting diode device according to an exemplary embodiment of the present invention includes a metal nanocrystal or a semiconductor nanocrystal selected from the group consisting of II-VI compounds, III-V compounds, IV-VI compounds and IV compounds, or mixtures thereof.

The II-VI compounds include binary compounds such as CdS, CdSe, CdTe, ZnS, ZnSe, ZnTe, ZnO, HgS, HgSe or HgTe, for example, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS or HgZnSe, for example, or quaternary compounds such as CdZnSeS, CdZnSeTe, CdZnSTe, CdHgSeS, CdHgSeTe, CdHgSTe, HgZnSeS, HgZnSeTe or HgZnSTe, for example, but are not limited thereto.

The III-V compounds include binary compounds such as GaN, GaP, GaAs, GaSb, AlN, AlP, AlAs, AlSb, InN, InP, InAs or InSb, for example, ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs or AlInSb, for example, or quaternary compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb, for example, but are not limited thereto.

The IV-VI compounds include binary compounds such as SnS, SnSe, SnTe, PbS, PbSe or PbTe, for example, ternary compounds such as SnSeS, SnSeTe, SnSTe, PbSeS, PbSeTe, PbSTe, SnPbS, SnPbSe or SnPbTe, for example, or quaternary compounds such as SnPbSSe, SnPbSeTe or SnPbSTe, for example, but are not limited thereto.

The IV compounds include unary compounds such as Si or Ge, for example, or binary compounds such as SiC or SiGe, for example, but are not limited thereto.

The nanocrystal of the nanocrystal-metal oxide monolith 40 in the light emitting diode device according to alternative exemplary embodiments of the present invention is not limited to the compounds listed above.

Furthermore, the nanocrystal may have a core-shell structure including an overcoating, e.g., a shell, around a core. In exemplary embodiments, the overcoating material may be selected from the group consisting of II-VI compounds, III-V compounds, IV-VI compounds and IV compounds, or mixtures thereof, as described above in greater detail.

A metal oxide of the nanocrystal-metal oxide monolith 40 in a light emitting diode device according to an exemplary embodiment of the present invention includes titanium dioxide ("$TiO_2$"), zinc oxide ("ZnO"), silicon dioxide ("$SiO_2$"), tin dioxide ("$SnO_2$"), tungsten trioxide ("$WO_3$"), tantalum oxide ("$Ta_2O_3$"), barium titanate ("$BaTiO_3$"), barium zirconium trioxide ("$BaZrO_3$"), zirconium oxide ("$ZrO_2$"), hafnium oxide ("$HfO_2$"), aluminum oxide ("$Al_2O_3$"), yttrium Oxide ("$Y_2O_3$"), zirconium silicate ("$ZrSiO_4$"), ferric oxide ("$Fe_2O_3$"), ferrous ferric oxide ("$Fe_3O_4$"), ceric oxide ("$CeO_2$") or chromium trioxide ("$CrO_3$"), or a mixture thereof, for example, but is not limited thereto.

Alternative exemplary embodiments of the present invention include electronic devices having the light emitting diode device described in greater detail above. More specifically, the light emitting diode device according to exemplary embodiments of the present invention has a very bright light emitting diode with excellent luminous efficiency and stability. Thus, the light emitting diode device can be utilized in various devices such as a traffic light, an electric sign, lighting or a lamp for cars, sensors, a backlight source for display devices or a main light source for mobile information appliances such as a cell phone or a PDA, for example, but is not limited thereto. In addition, the light emitting diode device according to exemplary embodiments of the present invention is particularly attractive for use in lighting devices, due to the light emitting diode device having a long life span, low electricity consumption and durability against external impact. Furthermore, the light emitting diode device is particularly useful in backlights of various mobile appliances, due to the light emitting diode device having low electric power consumption and excellent brightness.

In yet another alternative exemplary embodiment of the present invention, a method for fabricating a light emitting diode device is provided. In the method for fabricating the light emitting diode device according to exemplary embodiments of the present invention, a typical fabrication method is used, except for a method for forming a light emission layer. To synthesize a nanocrystal, any conventional technique may be used.

The light emitting diode device according to exemplary embodiments may have an emission wavelength in a range of about 300 nm to about 3000 nm. Moreover, the light emitting diode device may emit white light by forming an emission layer having two or more nanocrystal-metal oxide composites which emit light at different wavelengths.

A method for fabricating the light emitting diode device according to an exemplary embodiment of the present invention will now be described in further detail.

First, a substrate having a lead frame is formed. A light emitting diode chip is disposed on the substrate such that the lead frame is electrically connected to the light emitting diode chip. Using a wet synthesis method, nanocrystals having high luminous efficiency are prepared and separated. Next, the nanocrystals are surface substituted with mercapto alcohol, for example, so that they mix well with a mixture of silica monomers, and the nanocrystals are then separated. The separated nanocrystals are mixed with silica monomers, water, alcohol and a catalyst, for example, are dried at an appropriate temperature, and are then cured at a temperature of about 100° C. Thus, prepared nanocrystal-metal oxide monolith is installed on the light emitting diode chip, and the light emitting diode is then sealed with a transparent liquid resin. The transparent resin is then cured to form a mold layer.

In yet another exemplary embodiment of the present invention, a method for fabricating a light emitting diode device includes preparing a nanocrystal-metal oxide monolith and installing the nanocrystal-metal oxide monolith onto a light emitting diode chip, as will now be described in further detail below.

To prepare the nanocrystal-metal oxide monolith, nanocrystals are separated via precipitation, and a nanocrystal-metal oxide precursor solution containing a metal oxide precursor, a solvent and a catalyst is mixed. Typical hydrophilic solvents and acid or base catalysts used in a polymerization reaction of the metal oxide precursor can be used, for example, but are not limited thereto. The nanocrystal-metal oxide precursor solution is disposed in a predetermined amount at room temperature onto a mold having a desired shape and size. The polymerization reaction is carried out on the coated solution to obtain a wet nanocrystal-metal oxide monolith. A material having a shape which is not deformed by a chemical substance used in the reaction, such as plastic, glass or quartz, for example, can be used as a mold, but is not limited thereto.

Next, the hydrophilic solvent and acid or base catalyst used in preparing the wet nanocrystal-metal oxide monolith is dried, and the dried nanocrystal-metal oxide composite is formed into a monolith shape which has no cracks, due to predetermined polymerization conditions. To form a more stable metal oxide composite, the dried nanocrystal-metal oxide composite is then cured at a temperature of about 100° C. or higher.

In preparing the nanocrystal-metal oxide monolith, at least one kind of nanocrystal can be mixed. More specifically, the step of preparing the nanocrystal-metal oxide monolith is repeated twice or more to prepare a multilayered nanocrystal-metal oxide monolith, as described above in reference to FIGS. 2a and 2b. Further, the multilayered nanocrystal-metal oxide monolith can be prepared by using the same or different nanocrystal-metal oxide composites, and individual layers of the multilayered nanocrystal-metal oxide monolith may be arranged in a horizontal or vertical manner. When individual layers of the multilayered nanocrystal-metal oxide monolith are arranged in horizontal direction, as shown in FIG. 2a, a monolith including nanocrystals with low emission wavelength energy is positioned closest to a light source, and a monolith including nanocrystals with high emission wavelength energy is positioned on the monolith including nanocrystals with low emission wavelength energy. As a result, reabsorption of light is effectively prevented or thereby reduced.

In addition, when the multilayered nanocrystal-metal oxide monolith is used, a monolith including different types of nanocrystals can be arranged on the light emitting diode chip, and one type of nanocrystals may thereby be disposed in a direction of light progression from a light source, further minimizing reabsorption of light due to an energy difference.

Finally, in an exemplary embodiment of the present invention having a plurality of chips in a package, monoliths can be installed in each chip.

Nanocrystals used in exemplary embodiments of the present invention may be prepared by a method known in the technical field of the present invention. For example, nanocrystals are prepared by adding precursors of V or VI Group to a mixture system of a dispersing agent containing precursors of II, III, or IV Group and a solvent. The mixture reacts and nanocrystals are grown.

Examples of metal oxide precursors used in the step of preparing a core or a shell of nanocrystals include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate and indium sulfate, for example, but are not limited thereto.

Examples of VI Group or V Group compounds suitable for forming the core include alkyl thiol compounds such as hexane thiol, octane thiol, decane thiol, dodecane thiol, hexadecane thiol, or mercapto propyl silane, alkyl phosphines such as sulfur-trioctylphosphine ("S-TOP"), sulfur-tributylphosphine ("S-TBP"), sulfur-triphenylphosphine ("S-TPP"), sulfur-trioctylamine ("S-TOA"), trimethylsilyl sulfur, ammonium sulfide, sodium sulfide, selenium-trioctylphosphine ("Se-TOP"), selenium-tributylphosphine ("Se-TBP"), selenium-triphenylphosphine ("Se-TPP"), tellurium-tributylphosphine ("Te-TBP"), tellurium-triphenylphosphine ("Te-TPP"), trimethylsilyl phosphine, triethylphosphine, tributylphosphine, trioctylphosphine, triphenylphosphine, tricyclohexyl phosphine arsenic oxide, arsenic chloride, arsenic sulfate, arsenic bromide, arsenic iodide, nitrous oxide, nitric acid or ammonium nitrate, for example, but are not limited thereto.

Specific examples of the solvent usable in preparing nanocrystals include primary amines having 6 to 22 carbon atoms, secondary amines having 6 to 22 carbon atoms or tertiary amines having 6 to 22 carbon atoms; primary alcohols having 6 to 22 carbon atoms, secondary alcohols having 6 to 22 carbon atoms or tertiary alcohols having 6 to 22 carbon atoms; ketones and esters each having 6 to 22 carbon atoms; heterocyclic compounds including nitrogen or sulfur each having 6 to 22 carbon atoms; alkane having 6 to 22 carbon atoms, alkene having 6 to 22 carbon atoms or alkyne having 6 to 22 carbon atoms; and trioctylamine, trioctylphosphine or trioctylphosphine oxide, for example, but are not limited thereto.

The metal oxide precursor includes metal alkoxide, metal halide or metal hydroxide, but alternative exemplary embodiments of the present invention are not limited thereto.

The metal alkoxide compounds include titanium methoxide, titanium ethoxide, titanium isopropoxide, titanium butoxide, zinc methoxide, zinc ethoxide, zinc isopropoxide, zinc butoxide, tetramethyl orthosilicate, tetraethyl orthosilicate, silicon tetraisopropoxide, silicon tetrabutoxide, trimethoxy silane, triethoxy silane, mercapto propyl trimethoxy silane, mercapto propyl triethoxy silane, amine propyl trimethoxy silane, amine propyl triethoxy silane, tin methoxide, tin ethoxide, tin isopropoxide, tin butoxide, tungsten methoxide, tungsten ethoxide, tungsten isopropoxide, tungsten butoxide, tantalum methoxide, tantalum ethoxide, tantalum isopropoxide, tantalum butoxide, barium methoxide, barium ethoxide, barium isopropoxide, barium butoxide, zirconium methoxide, zirconium ethoxide, zirconium isopropoxide, zirconium butoxide, aluminum methoxide, aluminum ethoxide, aluminum isopropoxide, aluminum butoxide, yttrium methoxide, yttrium ethoxide, yttrium isopropoxide, yttrium butoxide, iron methoxide, iron ethoxide, iron isopropoxide, iron butoxide, cesium methoxide, cesium ethoxide, cesium isopropoxide, cesium butoxide, chromium methoxide, chromium ethoxide, chromium isopropoxide or chromium butoxide, or mixtures thereof, for example, but are not limited thereto.

The metal halide compounds include titanium chloride, zinc chloride, silicon tetrachloride, tin chloride, tungsten chloride, tantalum chloride, barium chloride, zirconium chloride, hafnium chloride, aluminum chloride, yttrium chloride, iron (II) chloride, iron (III) chloride, cesium chloride, chromium chloride, titanium bromide, zinc bromide, silicon tetrabromide, tin bromide, tungsten bromide, tantalum bromide, barium bromide, zirconium bromide, hafnium bromide, aluminum bromide, yttrium bromide, iron (II) bromide, iron (III) bromide, cesium bromide, chromium bromide, titanium iodide, zinc iodide, silicon tetraiodide, tin iodide, tungsten iodide, tantalum iodide, barium iodide, zirconium iodide, hafnium iodide, aluminum iodide, yttrium iodide, iron (II) iodide, iron (III) iodide, cesium iodide or chromium iodide, or mixtures thereof, for example, but are not limited thereto.

The metal hydroxide include titanium hydroxide, zinc hydroxide, silicon hydroxide, tin hydroxide, tungsten hydroxide, tantalum hydroxide, barium hydroxide, zirconium hydroxide, hafnium hydroxide, aluminum hydroxide, yttrium hydroxide, iron (II) hydroxide, iron (III) hydroxide, cesium hydroxide or chromium hydroxide, or mixtures thereof, for example, but are not limited thereto.

The surface of the nanocrystal in the nanocrystal-metal oxide composite may include a surfactant. Further, the nanocrystals of the nanocrystal-metal oxide composite may include a hydrophilic surfactant which can mix well with the metal oxide precursor and a surfactant which maintains emissive and electrical properties by protecting the surface of the nanocrystal, for example. As a result, stability and moldability of the nanocrystal is improved while maintaining desired emissive and electrical properties thereof.

The nanocrystal of the nanocrystal-metal oxide composite may have various shapes such as a sphere, a tetrahedron, a cylinder, a rod, a triangle, a disc, a tripod, a tetrapod, a cube, a box, a star and a tube, for example. However, alternative exemplary embodiments of the present invention are not limited thereto. Further, the nanocrystal according to exemplary embodiments of the present invention may emit visible light, for example, or, in alternative exemplary embodiments, may emit ultraviolet or infrared light, for example, but is not limited thereto.

The surface of the nanocrystal may be aligned by an organic substance, thereby effectively improving suspension stability and effectively preventing cohesion between the nanocrystals. The organic substance may be formed by the solvent used in the growing process of the nanocrystals described above in greater detail. The organic substance may include alkane or alkene having 6 to 22 carbon atoms with a COOH group at an end, alkane or alkene having 6 to 22 carbon atoms with a $PO_3H_2$ group at the end, alkane or alkene having 6 to 22 carbon atoms with a PO group at the end, alkane or alkene having 6 to 22 carbon atoms with an SOOH group at the end and alkane or alkene having 6 to 22 carbon atoms with an $NH_2$ group at the end. More specifically, the organic substance may include oleic acid, stearic acid, palmitic acid, hexyl phosphonic acid, n-octyl phosphonic acid, tetradecyl phosphonic acid, octadecyl phosphonic acid, Trioctylphosphine oxide, n-octyl amine or hexadecyl amine, for example, but is not limited thereto.

Hereinafter, an exemplary embodiment of the present invention will be described in further detail with reference to an experiment. However, the exemplary embodiment described in the following experiment is for purposes of illustration only and is not to be construed as limiting alternative exemplary embodiments of the present invention in any way.

To prepare nanocrystals in the experiment, 16 g of trioctylamine ("TOA"), 0.3 g of octadecyl phosphonic acid and 0.4 mmol of cadmium oxide were simultaneously charged into a 125 ml flask equipped with a reflux condenser to form a mixture. The mixture was stirred, and the reaction temperature was adjusted to 300° C. Separately, a Se powder was dissolved in trioctylphosphine ("TOP") to produce selenium-trioctylphosphine ("Se-TOP") complex solution in which the Se concentration was about 2M. 2 ml of 2M Se-TOP complex solution was quickly injected into the reaction mixture being stirred, and the mixture was reacted for 2 minutes. The temperature of the reaction mixture was then quickly lowered to room temperature. Ethanol, a non solvent, was added to the reaction mixture, and centrifugation was carried out on the mixture. The supernatant of the solution excluding the centrifuged precipitates was discarded. The precipitates were dispersed in toluene, and a CdSe nanocrystal solution which emits light at 458 nm was synthesized.

8 g of TOA, 0.1 g of oleic acid and 0.4 mmol of zinc acetate were simultaneously charged into a 125 ml-flask equipped with a reflux condenser to form a mixture. The mixture was stirred, and the reaction temperature was adjusted to 300° C. The synthesized CdSe nanocrystal solution described above was added to the reactant. Then, an S-TOP complex solution was slowly added to the mixture and reacted for 1 hour to grow ZnS nanocrystal on the surface of the CdSe nanocrystal, and a CdSe/ZnS alloy nanocrystal was formed via diffusion at the interface. When the reaction was completed, the temperature of the reaction mixture was quickly lowered to room temperature. Ethanol, a non solvent, was added to the reaction mixture, and centrifugation was carried out on the mixture. The supernatant of the solution excluding the centrifuged precipitates was discarded. The precipitates were dispersed in toluene, and a solution of CdSe/ZnS alloy nanocrystal with a size of 5 nm and which emits light at 458 nm was synthesized.

8 g of TOA, 0.1 g of oleic acid, 0.1 mmol of cadmium oxide and 0.4 mmol of zinc acetate were then simultaneously charged to a 125 ml-flask equipped with a reflux condenser to form a mixture. The mixture was stirred, and the reaction temperature was adjusted to 300° C. The synthesized CdSe/

ZnS nanocrystal solution described above was added to the reactant. Then, an S-TOP complex solution was slowly added to the mixture and reacted for 1 hour to grow CdSZnS nanocrystal on the surface of the CdSe/ZnS nanocrystal, and a CdSe/ZnS/CdZnS nanocrystal which emits light at 554 nm was synthesized.

When the reaction was completed, the temperature of the reaction mixture was quickly lowered to room temperature. Ethanol, a non solvent, was added to the reaction mixture, and centrifugation was carried out on the mixture. The supernatant of the solution excluding the centrifuged precipitates was discarded. The precipitates were dispersed in toluene, and a CdSe/ZnS/CdZnS nanocrystal solution was synthesized. A quantum efficiency of the nanocrystal was determined to be 67%.

Figure 3:
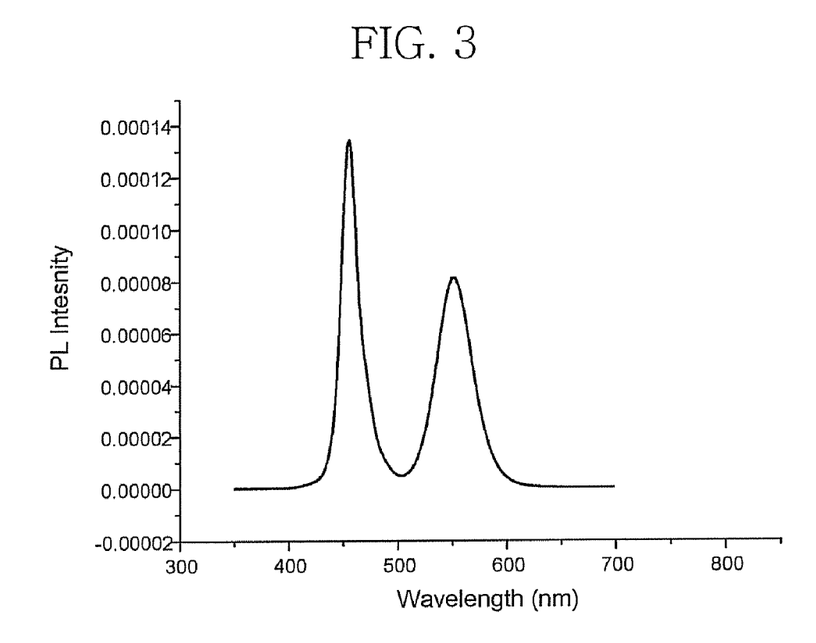
FIG. 3 is a graph of intensity versus wavelength illustrating an emission spectrum of a light emitting diode device according to an exemplary embodiment of the present invention.

To fabricate nanocrystalline silica monolith and a light emitting diode device, ethanol was first added to a 1 wt % toluene solution of the CdSe/ZnS/CdZnS nanocrystal described above. The mixture was centrifuged to separate precipitates. Then, pyridine was added to the precipitates and stirred until the mixture became a transparent solution. Hexane was added to the nanocrystal pyridine solution, and the precipitates were separated. The precipitates were again dissolved in a pyridine solution containing 100 μl of 6-mercaptohexanol and propylamine. The mixture was stirred for about 2 hours. Hexane was again added to the solution, and the precipitates were separated. 200 μl of tetraethoxy silane ("TEOS"), 100 μl of ethanol, 100 μl of propylamine and 50 μl of water were added to the precipitates and stirred. Then the mixture was poured into a round mold and dried at room temperature to obtain CdSe/ZnS/CdZnS nanocrystal-silica composite. The composite was subjected to heat treatment at about 100° C. under a nitrogen atmosphere to cure the silica. A blue LED chip with about 10 lm/W efficiency at about 455 nm $\lambda_{max}$ (manufactured by SEOUL SEMICONDUCTOR) was used in the experiment. More specifically, the blue LED chip had a size of about 300 μm×about 300 μm. The monolith was cut to the size of the blue LED chip using a glass cutter and was then placed on the blue LED chip. Then, the monolith was fixed on the blue LED chip by coating with the polymer resin. A voltage of about 3 V was applied and a current of about 20 mA flowed through the fabricated light emitting diode, and the resulting emission spectrum was measured. The spectrum is shown in FIG. 3, which is a graph of intensity versus wavelength illustrating the emission spectrum of a light emitting diode device according to an exemplary embodiment of the present invention in the experiment. Referring to FIG. 3, the light transition efficiency was approximately 46%.

A light emitting diode device according to exemplary embodiments of the present invention includes a nanocrystal-metal oxide monolith employed as an emission layer of a light emitting diode of the light emitting diode device, resulting in the light emitting diode device having high emission efficiency and stability. More specifically, light emitted from a nanocrystal passes through the nanocrystal, a metal oxide and a polymer medium, thereby controlling a gradation of a refractive index, maximizing light emission.

In a method for manufacturing the light emitting diode device according exemplary embodiments of the present invention, a concentration of the nanocrystal can be adjusted easily. Thus, the concentration of the luminescent material in the emission layer is uniform. Further, the fabricating process in the method for fabricating the light emitting diode device of the present invention is simple, providing easy and efficient fabrication of the light emitting diode.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims

What is claimed is:

1. A light emitting diode device comprising:
   a light emitting diode chip having a light emitting surface; and
   a nanocrystal-metal oxide monolith comprising a nanocrystal-metal oxide composite,
   wherein the nanocrystal-metal oxide monolith is disposed on the light emitting surface of the light emitting diode chip,
   wherein the nanocrystal-metal oxide composite comprises a nanocrystal and a metal oxide, wherein the metal oxide comprises a cured silica product, and
   wherein the nanocrystal and the metal oxide are in the nanocrystal-metal oxide monolith; and wherein the nanocrystal-metal oxide monolith has two or more layers.

2. The light emitting diode device according to claim 1, wherein the nanocrystal-metal oxide monolith further comprises a plurality of nanocrystal-metal oxide composites and each layer of the two or more layers of the nanocrystal-metal oxide monolith corresponds to a nanocrystal-metal oxide composite of the plurality of nanocrystal-metal oxide composites.

3. The light emitting diode device according to claim 1, wherein each layer of the two or more layers of the nanocrystal-metal oxide monolith is arranged in a substantially horizontal direction, wherein the horizontal direction is a direction substantially parallel to a major surface of the nanocrystal-metal oxide monolith.

4. The light emitting diode device according to claim 1, wherein a gap between the light emitting diode chip and the nanocrystal-metal oxide monolith has a range of about 0.1 mm to about 1 mm.

5. The light emitting diode device according to claim 1, wherein the metal oxide of the nanocrystal-metal oxide composite comprises $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO_2$ or $CrO_3$, or a mixture thereof.

6. An electronic device comprising the light emitting diode device according to claim 1.

7. The electronic device according to claim 6, wherein the electronic device includes a display device, a lighting device, a backlight unit or a sensor.

8. The light emitting diode device according to claim 1, wherein the nanocrystal of the nanocrystal-metal oxide composite comprises a metal nanocrystal or a semiconductor nanocrystal selected from the group consisting of II-VI compounds, III-V compounds, IV-VI compounds and IV compounds, or mixtures thereof.

9. The light emitting diode device according to claim 8, wherein:
   the II-VI compounds include compounds selected from the group consisting of a binary compound, a ternary compound and a quaternary compound;

the III-V compounds include compounds selected from the group consisting of a binary compound, a ternary compound and a quaternary compound;
the IV-VI compounds include compounds selected from the group consisting of a binary compound, a ternary compound and a quaternary compound; and
the IV compounds include compounds selected from the group consisting of a unary compound and a binary compound.

10. The light emitting diode device according to claim 9, wherein:
the binary compound of the II-VI compounds includes CdS, CdSe, CdTe, ZnS, ZnSe, ZnTe, ZnO, HgS, HgSe and HgTe;
the ternary compound of the II-VI compounds includes CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe;
the quaternary compound of the II-VI compounds includes CdZnSeS, CdZnSeTe, CdZnSTe, CdHgSeS, CdHgSeTe, CdHgSTe, HgZnSeS, HgZnSeTe and HgZnSTe;
the binary compound of the III-V compounds includes GaN, GaP, GaAs, GaSb, AlN, AlP, AlAs, AlSb, InN, InP, InAs and InSb;
the ternary compound of the III-V compounds includes GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb;
the quaternary compound of the III-V compounds includes GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb;
the binary compound of the IV-VI compounds includes SnS, SnSe, SnTe, PbS, PbSe and PbTe;
the ternary compound of the IV-VI compounds includes SnSeS, SnSeTe, SnSTe, PbSeS, PbSeTe, PbSTe, SnPbS, SnPbSe and SnPbTe;
the quaternary compound of the IV-VI compounds includes SnPbSSe, SnPbSeTe and SnPbSTe;
the unary compound of the IV compounds includes Si and Ge; and
the binary compound of the IV compounds includes SiC and SiGe.

11. The light emitting diode device according to claim 8, wherein the nanocrystal-metal oxide composite further comprises an over coating having a II-VI compound, a III-V compound, a IV-VI compound or a IV compound, or mixtures thereof.

12. The light emitting diode device according to claim 11, wherein:
the II-VI compounds include compounds selected from the group consisting of a binary compound, a ternary compound and a quaternary compound;
the III-V compounds include compounds selected from the group consisting of a binary compound, a ternary compound and a quaternary compound;
the IV-VI compounds include compounds selected from the group consisting of a binary compound, a ternary compound and a quaternary compound; and
the IV compounds include compounds selected from the group consisting of a unary compound and a binary compound.

13. The light emitting diode device according to claim 12, wherein:

the binary compound of the II-VI compounds includes CdS, CdSe, CdTe, ZnS, ZnSe, ZnTe, ZnO, HgS, HgSe and HgTe;
the ternary compound of the II-VI compounds includes CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe;
the quaternary compound of the II-VI compounds includes CdZnSeS, CdZnSeTe, CdZnSTe, CdHgSeS, CdHgSeTe, CdHgSTe, HgZnSeS, HgZnSeTe and HgZnSTe;
the binary compound of the III-V compounds includes GaN, GaP, GaAs, GaSb, AlN, AlP, AlAs, AlSb, InN, InP, InAs and InSb;
the ternary compound of the III-V compounds includes GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInP, AlInAs and AlInSb;
the quaternary compound of the III-V compounds includes GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb;
the binary compound of the IV-VI compounds includes SnS, SnSe, SnTe, PbS, PbSe and PbTe;
the ternary compound of the IV-VI compounds includes SnSeS, SnSeTe, SnSTe, PbSeS, PbSeTe, PbSTe, SnPbS, SnPbSe and SnPbTe;
the quaternary compound of the IV-VI compounds includes SnPbSSe, SnPbSeTe and SnPbSTe;
the unary compound of the IV compounds includes Si and Ge; and
the binary compound of the IV compounds includes SiC and SiGe.

14. A method for fabricating a light emitting diode having a nanocrystal-metal oxide composite, the method comprising:
forming a nanocrystal-metal oxide monolith; and
disposing the nanocrystal-metal oxide monolith onto a light emitting diode chip, wherein the forming of the nanocrystal-metal oxide monolith comprises:
combining a nanocrystal, a metal oxide precursor, a solvent and a catalyst to form a nanocrystal-metal oxide precursor solution;
forming a wet nanocrystal-metal oxide monolith by charging the nanocrystal-metal oxide precursor solution into a mold and subjecting the nanocrystal-metal oxide precursor solution charged into the mold to a polymerization reaction;
forming the nanocrystal-metal oxide monolith by drying and curing the wet nanocrystal-metal oxide monolith charged into the mold; and
forming a multilayered nanocrystal-metal oxide monolith by successively repeating the forming the nanocrystal-metal oxide monolith two or more times.

15. The method according to claim 14, wherein the multilayered nano crystal-metal oxide monolith is formed by using one of a same nanocrystal-metal oxide composite or different nanocrystal-metal oxide composites.

16. The method according to claim 14, wherein each layer of the multilayered nano crystal-metal oxide monolith is arranged in one of a horizontal direction or a vertical direction.

17. The method according to claim 14, wherein the metal oxide precursor includes a metal alkoxide, a metal halide or a metal hydroxide.

18. The light emitting diode device according to claim 1, wherein each layer of the two or more layers of the nanocrystal-metal oxide monolith is arranged in a substantially vertical direction, wherein the vertical direction is a direction substantially perpendicular to a major surface of the nanocrystal-metal oxide monolith.

19. The light emitting diode device according to claim 1, wherein each layer of the two or more layers of the nanocrystal-metal oxide monolith has a substantially uniform thickness along a length of each respective layer.

20. The light emitting diode device according to claim 1, wherein the nanocrystal-metal oxide composite consists of the nanocrystal and the metal oxide.

21. A method for fabricating a light emitting diode having a nanocrystal-metal oxide composite, the method comprising:
   forming a nanocrystal-metal oxide monolith; and
   disposing the nanocrystal-metal oxide monolith onto a light emitting diode chip, wherein the forming of the nanocrystal-metal oxide monolith comprises:
   combining a nanocrystal, a metal oxide precursor, a solvent and a catalyst to form a nanocrystal-metal oxide precursor solution;
   forming a wet nanocrystal-metal oxide monolith by charging the nanocrystal-metal oxide precursor solution into a mold and subjecting the nanocrystal-metal oxide precursor solution charged into the mold to a polymerization reaction; and
   forming the nanocrystal-metal oxide monolith by drying and curing the wet nanocrystal-metal oxide monolith charged into the mold; wherein the metal oxide precursor includes dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate or indium sulfate, or a mixture thereof.

22. A method for fabricating a light emitting diode having a nanocrystal-metal oxide composite, the method comprising:
   forming a nanocrystal-metal oxide monolith; and
   disposing the nanocrystal-metal oxide monolith onto a light emitting diode chip, wherein the forming of the nanocrystal-metal oxide monolith comprises:
   combining a nanocrystal, a metal oxide precursor, a solvent and a catalyst to form a nanocrystal-metal oxide precursor solution;
   forming a wet nanocrystal-metal oxide monolith by charging the nanocrystal-metal oxide precursor solution into a mold and subjecting the nanocrystal-metal oxide precursor solution charged into the mold to a polymerization reaction; and
   forming the nanocrystal-metal oxide monolith by drying and curing the wet nanocrystal-metal oxide monolith charged into the mold;
   wherein the nanocrystal is manufactured by:
      preparing a solution of the nanocrystals;
      precipitating the nanocrystals from the solution;
      dissolving the nanocrystals in pyridine to form a pyridine solution;
      reprecipitating the nanocrystals from the pyridine solution; and
      adding a metal oxide precursor to the nanocrystals to form the nanocrystal-metal oxide monolith.

23. The method of claim 22, further comprising redissolving the nanocrystals in a pyridine solution that comprises 6-mercaptohexanol; reprecipitating the nanocrystals from the pyridine solution that comprises 6-mercaptohexanol; and adding a metal oxide precursor to the nanocrystals to form the nanocrystal-metal oxide monolith.

* * * * *